(12) United States Patent
Khor et al.

(10) Patent No.: US 7,741,161 B2
(45) Date of Patent: Jun. 22, 2010

(54) METHOD OF MAKING INTEGRATED CIRCUIT PACKAGE WITH TRANSPARENT ENCAPSULANT

(75) Inventors: Ah Lek Khor, Ipoh (MY); Kock Huat Lee, Ipoh (MY); Boon Meng Chan, Ipoh (MY); Min Kong Thum, Perak (MY); Hong Mun Tung, Perak (MY); Mun Tuck Cheong, Ipoh (MY)

(73) Assignee: Carsem (M) Sdn. Bhd., Ipoh (MY)

(*) Notice: Subject to any disclaimer, the term of this patent is extended or adjusted under 35 U.S.C. 154(b) by 0 days.

(21) Appl. No.: 12/164,340

(22) Filed: Jun. 30, 2008

(65) Prior Publication Data

US 2008/0286901 A1    Nov. 20, 2008

Related U.S. Application Data

(62) Division of application No. 11/027,920, filed on Dec. 29, 2004, now abandoned.

(30) Foreign Application Priority Data

Dec. 31, 2003    (MY) ................ PI 20035051

(51) Int. Cl.
*H01L 21/56* (2006.01)
(52) U.S. Cl. .................................. 438/124
(58) Field of Classification Search ......... 257/666–677, 257/E23.031–E23.059, 685–686, 723, E25.031–E25.032, 257/E23.042, 100, 43, 667, 787–796, E31.117–E31.118, 257/E51.02, E23.116–E23.14, 678–733, 257/E21.502–E21.504; 438/6, E25.031–E25.032, 438/E23.042, 66–67, 107, 109, 406, 455–459, 438/15, 25–28, 51, 55, 64–68, 112, 124, 438/126, 127, 371–374, 123

See application file for complete search history.

(56) References Cited

U.S. PATENT DOCUMENTS

| 3,778,887 A | 12/1973 | Suzuki et al. |
| 5,122,860 A | 6/1992 | Kikuchi et al. |
| 5,134,773 A | 8/1992 | LeMaire et al. |
| 5,172,214 A | 12/1992 | Casto |
| 5,417,905 A | 5/1995 | Lemaire et al. |
| 5,637,913 A | 6/1997 | Kajijara et al. |

(Continued)

FOREIGN PATENT DOCUMENTS

DE        100 14 306 A1    10/2001

(Continued)

OTHER PUBLICATIONS

Applewhite, "Since you asked [technology forecast survey]", Spectrum, IEEE vol. 40, No. 1,( Jan. 2003), pp. 11-16.

(Continued)

*Primary Examiner*—Dao H Nguyen
*Assistant Examiner*—Tram H Nguyen
(74) *Attorney, Agent, or Firm*—Townsend and Townsend and Crew LLP

(57) ABSTRACT

A method for making an IC package with transparent encapsulant includes providing a leadframe, where the leadframe includes a first die pad and a second die pad, disposing a first die on the first die pad and a second die on the second die pad, forming a cavity on the leadframe, where the cavity includes the first die pad and the second die pad, injecting an encapsulant material into the cavity and cutting the injected encapsulant material and the leadframe to form a first IC package and a second IC package. The encapsulant material is transparent for visible wavelengths. The injection of the encapsulant material is performed at an encapsulant temperature ranging from 140° C. to 160° C.

11 Claims, 6 Drawing Sheets

U.S. PATENT DOCUMENTS

| | | | |
|---|---|---|---|
| 5,854,740 | A | 12/1998 | Cha |
| 5,854,741 | A * | 12/1998 | Shim et al. ............ 361/813 |
| 5,863,810 | A | 1/1999 | Kaldenberg |
| 5,869,353 | A | 2/1999 | Levy et al. |
| 5,877,546 | A | 3/1999 | You |
| 5,942,794 | A | 8/1999 | Okumura et al. |
| 6,043,109 | A | 3/2000 | Yang et al. |
| 6,091,134 | A | 7/2000 | Sakamoto et al. |
| 6,130,473 | A | 10/2000 | Mostafazadeh et al. |
| 6,137,160 | A | 10/2000 | Ishikawa |
| 6,143,981 | A | 11/2000 | Glenn |
| 6,215,177 | B1 | 4/2001 | Corisis et al. |
| 6,229,200 | B1 | 5/2001 | Mclellan et al. |
| 6,242,281 | B1 | 6/2001 | Mclellan et al. |
| 6,281,568 | B1 | 8/2001 | Glenn et al. |
| 6,355,502 | B1 | 3/2002 | Kang et al. |
| 6,377,742 | B1 | 4/2002 | Go |
| RE37,690 | E | 5/2002 | Kitano et al. |
| 6,433,277 | B1 | 8/2002 | Glenn |
| 6,455,356 | B1 | 9/2002 | Glenn et al. |
| 6,483,177 | B1 | 11/2002 | Yee |
| 6,521,987 | B1 | 2/2003 | Glenn et al. |
| 6,563,201 | B1 | 5/2003 | Golz |
| 6,605,866 | B1 | 8/2003 | Crowley et al. |
| 6,611,047 | B2 | 8/2003 | Hu et al. |
| 6,630,728 | B2 | 10/2003 | Glenn |
| 6,684,496 | B2 | 2/2004 | Glenn |
| 6,696,750 | B1 | 2/2004 | Yin et al. |
| 6,703,700 | B2 | 3/2004 | Hsu et al. |
| 6,821,818 | B2 * | 11/2004 | Chen et al. ............ 438/112 |
| 6,841,414 | B1 | 1/2005 | Hu et al. |
| 6,841,888 | B2 | 1/2005 | Yan et al. |
| 6,867,483 | B2 | 3/2005 | Huat et al. |
| 6,885,086 | B1 | 4/2005 | Fogelson et al. |
| 6,927,483 | B1 | 8/2005 | Lee et al. |
| 2002/0001869 | A1 | 1/2002 | Fjelstad |
| 2002/0105063 | A1 | 8/2002 | Huat et al. |
| 2003/0073265 | A1 | 4/2003 | Hu et al. |
| 2004/0089926 | A1 | 5/2004 | Hsu et al. |
| 2004/0130007 | A1 | 7/2004 | Hsu et al. |
| 2004/0178483 | A1 | 9/2004 | Hsu et al. |
| 2005/0067676 | A1 | 3/2005 | Mahadevan et al. |
| 2006/0148127 | A1 | 7/2006 | Ong et al. |

FOREIGN PATENT DOCUMENTS

| | | |
|---|---|---|
| JP | 63-033854 A | 2/1988 |
| JP | 63-188964 A | 8/1988 |
| JP | 63-289951 A | 11/1988 |
| JP | 01-106456 A | 4/1989 |
| JP | 02-129948 A | 5/1990 |
| JP | 03-69248 A | 7/1991 |
| JP | 06-092076 A | 4/1994 |

OTHER PUBLICATIONS

Carsem, Inc., "Carsem Announces an Optically Transparent MLP (QFN)," [Press Release], (Sep. 14, 2004), 2 pages total.

Garrett, "Controlling Warpage in BGA Packages," BP Amoco Electronic Materials, Alpharetta, Georgia, retrieved from the Internet <<http://www.cooksonsemi.com/tech_art/pdfs/Controlling%20Warpage.pdf>>Semiconductor Packaging Symposium—Session VIII, SEMICON West 1999.

Srikanth et al., "A Viscoelastic Warpage Analysis of Molded Package," Technical Symposium, Semicon Singapore (2002), pp. 89-99.

Tummala et al., *Microelectronics Packaging Handbook*, Van Nostrand Reinhold, New York, (1989), pp. 554.

Zhao et al., "Warpage Control of Clear Compound Molded Packages," ASM Technology, Singapore, Semicon China Trade Show (Mar. 12-14, 2003), Shanghai, 5 pages total.

Proprietary material under MPEP § 724.02.

* cited by examiner

METHOD OF MAKING INTEGRATED CIRCUIT PACKAGE WITH TRANSPARENT ENCAPSULANT

CROSS-REFERENCES TO RELATED APPLICATIONS

This application is a divisional of U.S. application Ser. No. 11/027,920, filed Dec. 29, 2004, which claims priority to Malaysian Patent Application No. PI 20035051, filed in Malaysia on Dec. 31, 2003, each of which is commonly assigned and incorporated by reference herein for all purposes. This application is also related to U.S. application Ser. No. 10/869,981, filed Jun. 17, 2004, now abandoned, which is incorporated by reference herein for all purposes.

BACKGROUND OF THE INVENTION

The present invention relates in general to integrated circuit (IC) packaging. More particularly, the invention provides an IC package with transparent encapsulant and a method for making thereof. Merely by way of example, the invention is described as it applies to a package in compliance with certain JEDEC standard, but it should be recognized that the invention has a broader range of applicability.

Integrated circuits are usually packaged before being used in electronic systems. Integrated circuit (IC) packages often protect the integrated circuits from the surrounding environment but also provide electrical connections to other components of the electronic systems. For example, the IC packages include a plurality of leads that are connected to the integrated circuits, and such leads can transmit or receive electrical signals from other components of the electronic systems. In another example, the IC packages also include encapsulant materials that cover and protect at least parts of the integrated circuits and/or the electrical connections between the integrated circuits and the leads.

For certain applications, the integrated circuits include optical sensors, which are used in light sensitive or light activated devices such as laser diodes. To meet this demand, IC packages with transparent windows have been developed. FIG. 1 is a conventional IC package with a transparent window. The IC package 1 can be used as a ceramic dual-in-line package (CERDIP) of a charge-coupled device (CCD). As shown in FIG. 1, the package 1 includes a die 11, a ceramic lower plate 12, a leadframe 14, a ceramic upper plate 15 and a window 10. The lower plate 12 serves as a die pad. The die 11 includes an integrated circuit coupled to a light sensor 19.

Additionally, a die sealant 13 is applied to one side of a central portion of the die pad 12, and the die 11 is attached to the die pad 12 through the die sealant 13 by a heat treatment. Moreover, a ceramic sealant 16 is applied to top fringes of the die pad 12, and the lead frame 14 is mounted on the die pad 12 through the sealant 16. Also, the ceramic sealant 16 is applied to the lead frame 14, and the upper ceramic plate 15 is fixed onto the leadframe 14 through the sealant 16. Alternatively, the ceramic plate sealant 16 is provided to the lower side of the ceramic upper plate 15, and the ceramic upper plate 15 is mounted onto the lead frame 14. Through a heat treatment, the ceramic plate sealant 16 is molten to seal the lead framed 14 to the ceramic upper plate 15. Additionally, the die 11 and the inner leads of the lead frame 14 are electrically connected by conductive wires 18. The transparent window 10 is sealed by a transparent window sealant 17. For example, the sealant 17 is melted to seal the transparent window 10 to the upper portion of the ceramic upper plate 15 through a heat treatment. Moreover, the lead frame 14 is trimmed, and the fabrication of the package 1 is completed.

The IC package 1 has various weaknesses. For example, the fabrication process for coating the ceramic sealant 16 on the lower side of the ceramic upper plate 15 is complex and costly. Additionally, the desired sealant effect is difficult to achieve between the ceramic upper plate 15 and the window sealant 17. If the window 10 is peeled off from the ceramic upper plate 15, the IC package 1 can be significantly damaged.

FIG. 2 is another conventional IC package with a transparent window. A die 21 is placed on a die pad 22 of a lead frame 23. Lead fingers of the lead frame 23 have electrical connections 25 with the die 21. The die 21 includes an integrated circuit coupled to a light sensor 26. The die 21 and the die pad 22 are covered by a predetermined volume of transparent plastic 24. Thereafter the transparent plastic 24 is molded to form an IC package 2 with a transparent window. The transparent plastic 24 often has an expansion coefficient larger than those of other types of molding compounds. This large expansion coefficient can result in disassociation of the transparent plastic 24 from other components of the IC package 2 after some time of use. For example, the IC package 2 includes a copper die pad, copper leads, and a die surface. The die surface is made of silicon-based material. Such disassociation often leads to cracks and thereby damages the IC package.

Hence it is highly desirable to improve techniques for integrated circuit packaging.

BRIEF SUMMARY OF THE INVENTION

The present invention relates in general to integrated circuit (IC) packaging. More particularly, the invention provides an IC package with transparent encapsulant and a method for making thereof. Merely by way of example, the invention is described as it applies to a package in compliance with certain JEDEC standard, but it should be recognized that the invention has a broader range of applicability.

According to one embodiment of the present invention, a method for making an IC package with transparent encapsulant is provided. The method includes providing a leadframe. The leadframe includes a first die pad and a second die pad. Additionally, the method includes disposing a first die on the first die pad and a second die on the second die pad and forming a cavity on the leadframe. The cavity includes the first die pad and the second die pad. Moreover, the method includes injecting an encapsulant material into the cavity, and cutting the injected encapsulant material and the leadframe to form a first IC package and a second IC package. The encapsulant material is transparent for visible wavelengths, and the injecting an encapsulant material is performed at an encapsulant temperature ranging from 140° C. to 160° C.

According to another embodiment of the present invention, an apparatus for making an IC package with transparent encapsulant includes a leadframe. The leadframe includes an outer frame and a plurality of connecting bars. The plurality of connecting bars is attached to the outer frame and defines a plurality of inner frames arranged in a matrix pattern within the outer frame. The plurality of inner frames includes a plurality of die pads respectively. Additionally, the leadframe includes a plurality of side boundaries located approximately on the outer frame. The plurality of side boundaries, the outer frame, and the plurality of inner frames form at least parts of a cavity, and the cavity is at least partially filled with a transparent encapsulant material. The encapsulant material is transparent for visible wavelengths.

According to yet another embodiment of the present invention, an IC package with transparent encapsulant includes a die pad including a pad bottom surface, a die disposed on the die pad and including an integrated circuit, a plurality of leads including a plurality of lead bottom surfaces, a plurality of conductive wires connecting the die and the plurality of leads, and an encapsulant material. The encapsulant material is transparent for visible wavelengths. The pad bottom surface is exposed without being covered by the encapsulant material, and the plurality of lead bottom surfaces each are exposed without being covered by the encapsulant material.

Many benefits are achieved by way of the present invention over conventional techniques. Certain embodiments of the present invention provide IC packages with transparent encapsulants. For example, the transparent encapsulants are both reliable and durable. Some embodiments of the present invention provide a method that can easily apply transparent encapsulants. Certain embodiments of the present invention can prevent or reduce delamination of transparent encapsulants. For example, the delamination of transparent encapsulants may occur during cooling and result in warpage and delamination rejects of the IC packages. Some embodiments of the present invention use stress-relief structures in a leadframe. The stress-relief structures can prevent or reduce the propagation of delamination of transparent encapsulants. Certain embodiments of the present invention apply transparent encapsulants to only one side of a leadframe. The amount of transparent encapsulant used is reduced and the fabrication costs are lowered. Some embodiments of the present invention provide transparent IC packages with improved heat dissipation, smaller size, and/or lighter weight. Certain embodiments of the present invention use matrix arrays of packaging units. These packaging units are singulated as an individual optical devices and/or packages. For example, the matrix arrays allow the use of a single mould for making packages of various sizes and shapes. Some embodiments of the present invention provide locking mechanisms. For example, the locking mechanisms include extended parts. During encapsulation, the heat causes the encapsulants to melt and flow under the extended parts. After cooling, the encapsulants under the locking mechanisms can prevent or reduce the delamination of transparent encapsulants Various additional objects, features and advantages of the present invention can be more fully appreciated with reference to the detailed description and accompanying drawings that follow.

DETAILED DESCRIPTION OF THE INVENTION

The present invention relates in general to integrated circuit (IC) packaging. More particularly, the invention provides an IC package with transparent encapsulant and a method for making thereof. Merely by way of example, the invention is described as it applies to a package in compliance with certain JEDEC standard, but it should be recognized that the invention has a broader range of applicability.

Figure 1:
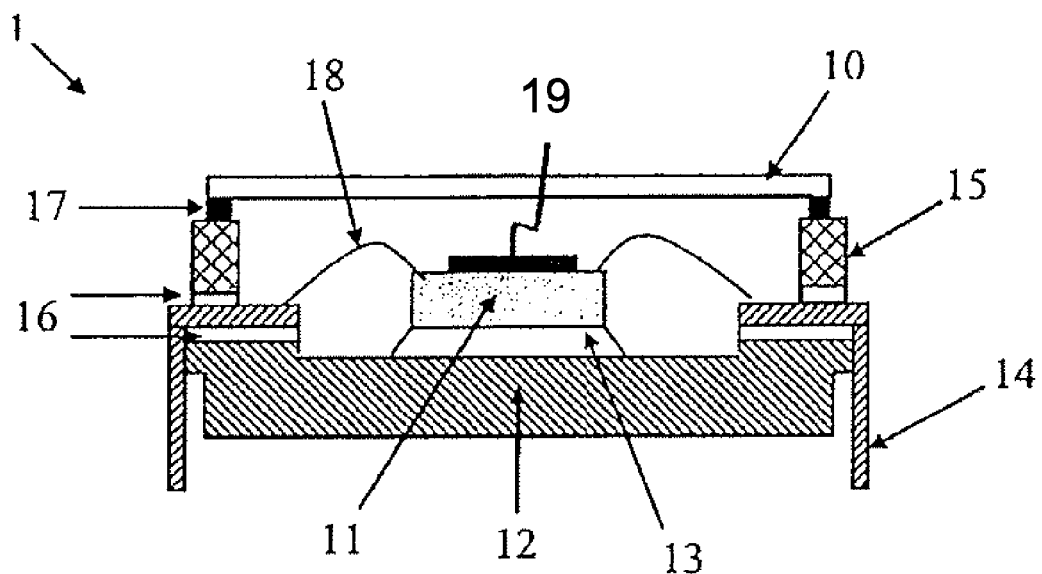
FIG. 1 is a conventional IC package with a transparent window.
Figure 2:
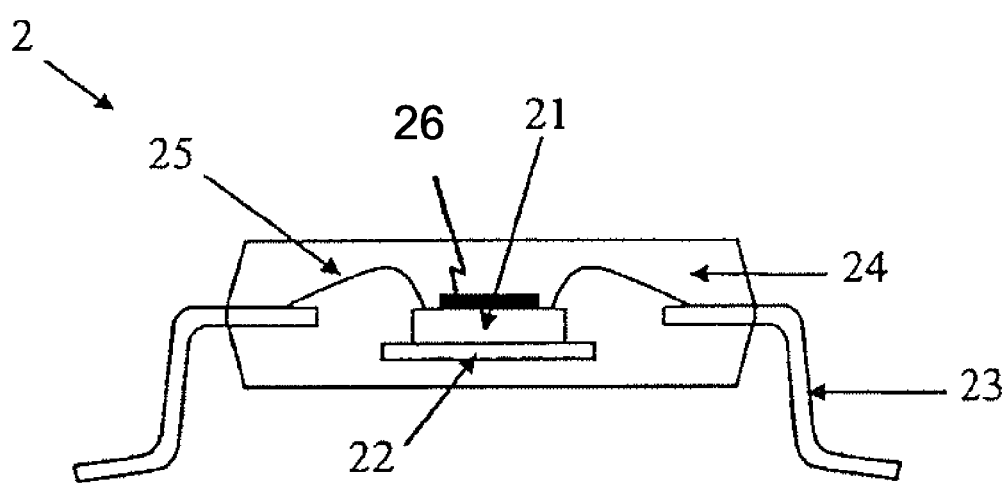
FIG. 2 is another conventional IC package with a transparent window.
Figure 3:
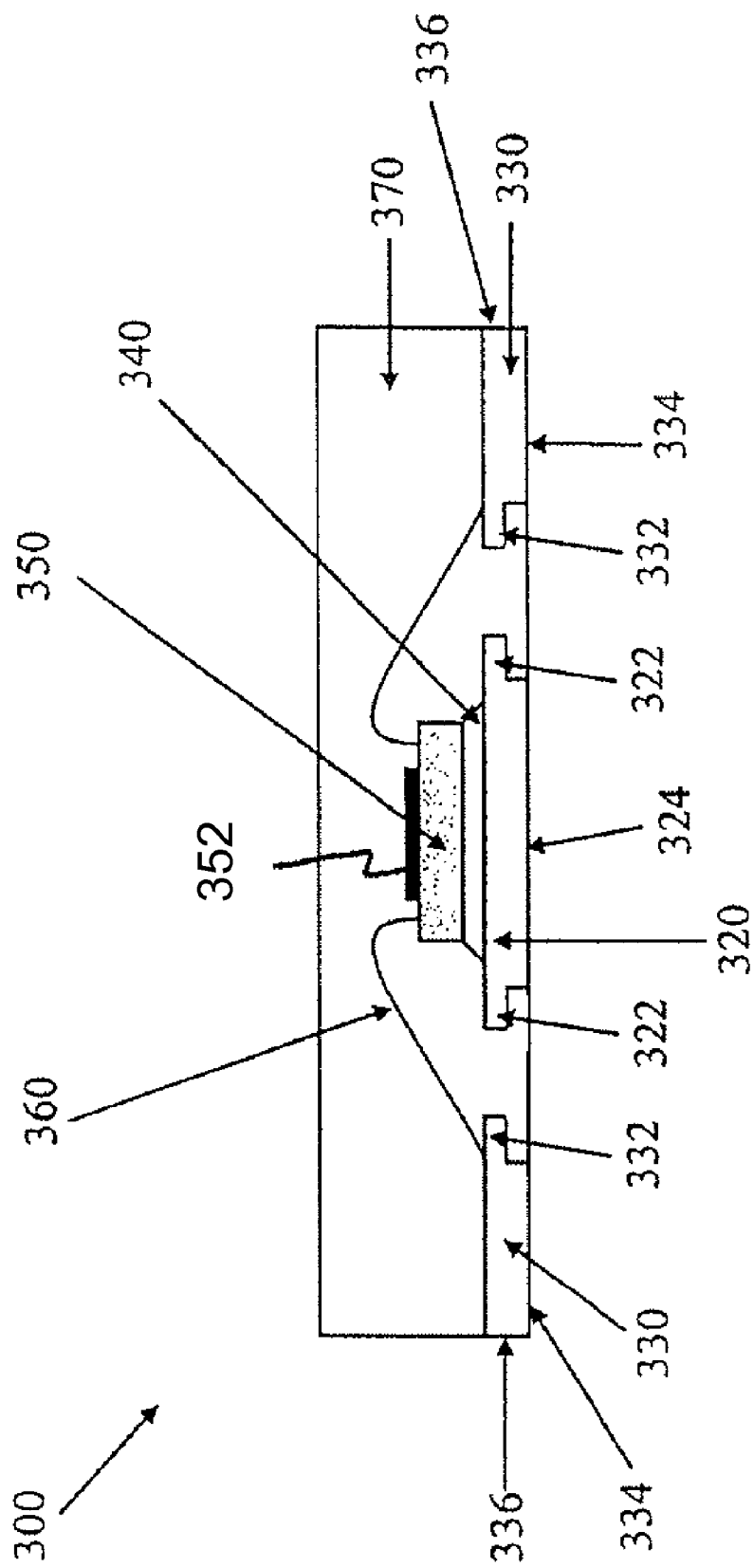
FIG. 3 is a simplified cross section of an IC package according to an embodiment of the present invention.

FIG. 3 is a simplified cross section of an IC package according to an embodiment of the present invention. This diagram is merely an example, which should not unduly limit the scope of the claims. One of ordinary skill in the art would recognize many variations, alternatives, and modifications. An IC package 300 includes a die pad 320, leads 330, a bonding layer 340, a die 350, conductive wires 360, and encapsulant material 370. Although the above has been shown using a selected group of components for the IC package 300, there can be many alternatives, modifications, and variations. For example, some of the components may be expanded and/or combined. Other components may be inserted to those noted above. For example, the die 350 includes a light sensor 352. In another example, the die 350 does not include the light sensor 352. Depending upon the embodiment, the arrangement of components may be interchanged with others replaced. Further details of these components are found throughout the present specification and more particularly below.

The die pad 320 includes extended parts 322 and a bottom surface 334. For example, the extended parts 322 are formed by shallowly machining away portions of the die pad. In another example, the bottom surface is exposed without being covered by the encapsulant material 370. The leads 330 each include an extended part 332 and a bottom surface 334. For example, the extended parts 332 are formed by shallowly machining away portions of the die pad. In another example, the bottom surface is exposed without being covered by the encapsulant material 370. The die 350 is attached to the die pad 320 through the bonding layer 340. As an example, the bonding layer 340 includes an epoxy. Additionally, the die 350 is connected to the leads 330 with the conductive wires 360. In one embodiment, the die 350 includes an integrated circuit. Moreover, the IC package 300 includes the encapsulant material 370. For example, the encapsulant material 370 surrounds the die pad 320, the leads 330, the bonding layer 340, the die 350, and the conductive wires 360, but not the bottom surfaces 324 and 334. In another example, the encapsulant material 370 also leaves side surfaces 336 of the leads 330 exposed.

The encapsulant material 370 is transparent. In one embodiment, the encapsulant material can be seen through by naked human eyes. In another embodiment, the encapsulant material provides a transmission rate higher than or equal to 80% for wavelengths higher than or equal to about 350 nm. For example, the wavelengths are in the range of visible light. In another example, the wavelengths are in the range of visible and ultra-violet light. In yet another embodiment, the encapsulant material is a clear plastic. For example, the plastic includes at least one selected from CV series of Matsushita Electric Works, Ltd, NT series of Nitto Denko Corporation, and MG-97 series from Henkel Corporation.

As discussed above and further emphasized here, FIG. 3 is merely an example, which should not unduly limit the scope of the claims. One of ordinary skill in the art would recognize many variations, alternatives, and modifications. In one embodiment, the package 300 is a micro leadframe package manufactured by Carsem. In another embodiment, the package 300 is in compliance with certain JEDEC standard. For example, the JEDEC standard is MO220 or MO229. In another example, the package 300 is a quad flat no-lead (QFN) package. In yet another example, the package 300 is a small outline no-lead (SON) package. In yet another embodiment, the leads 330 are fused with the die pad 320. In yet another embodiment, the package 300 includes two or more die pads.

Figure 4:
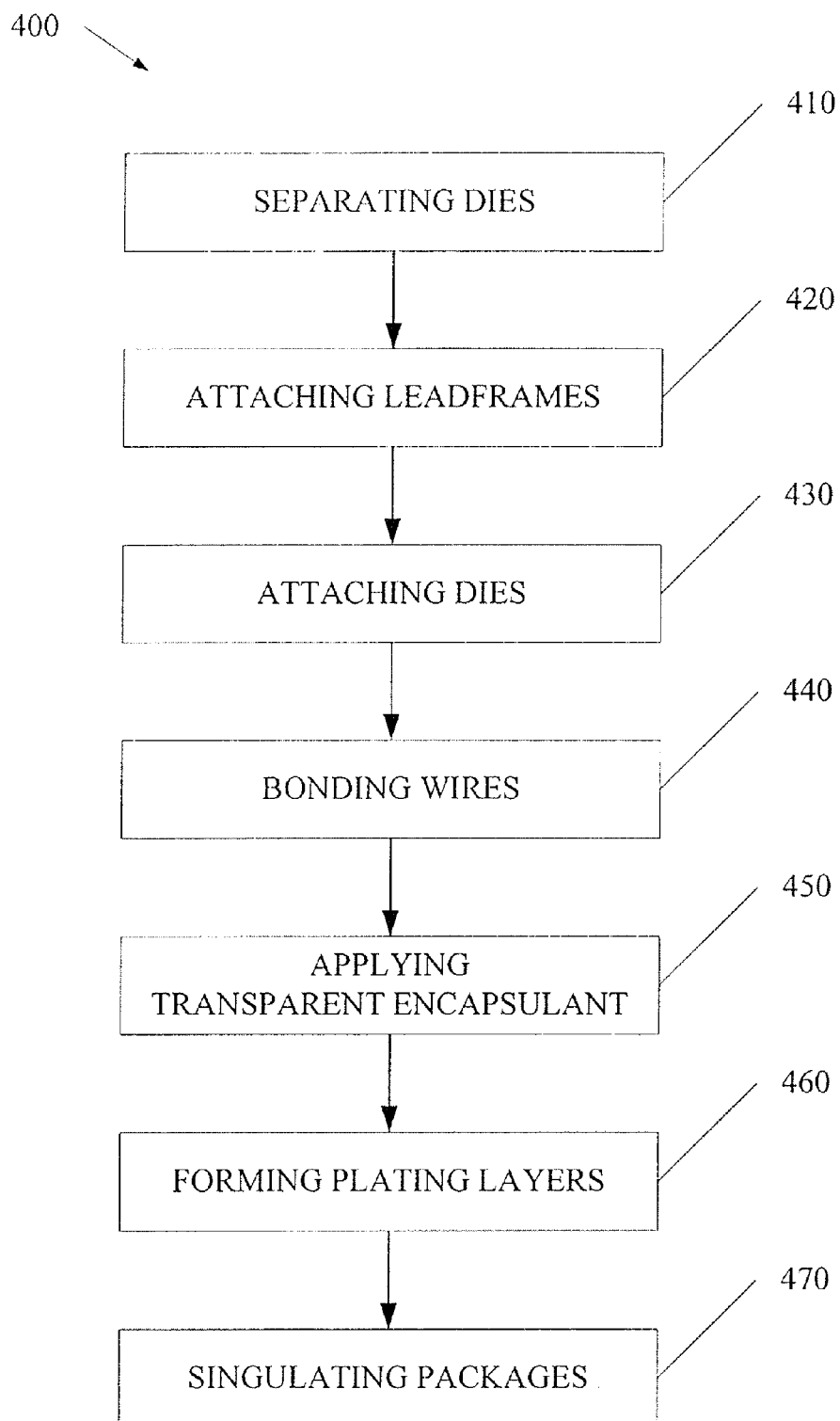
FIG. 4 is a simplified diagram for making an IC package with transparent encapsulant according to an embodiment of the present invention.

FIG. 4 is a simplified diagram for making an IC package with transparent encapsulant according to an embodiment of the present invention. This diagram is merely an example, which should not unduly limit the scope of the claims herein. One of ordinary skill in the art would recognize many variations, alternatives, and modifications. The method 400 includes a process 410 for separating dies, a process 420 for attaching leadframes, a process 430 for attaching dies, a process 440 for bonding wires, a process 450 for applying transparent encapsulant, a process 460 for forming plating layers, and a process 470 for singulating packages. Although the above has been shown using a selected sequence of processes, there can be many alternatives, modifications, and variations. For example, some of the processes may be expanded and/or combined. Other processes may be inserted to those noted above. Depending upon the embodiment, the specific sequence of processes may be interchanged with others replaced. For example, the method 400 is used to make the package 300. Future detail of the present invention can be found throughout the present specification and more particularly below.

At the process 410, dies on the same wafer are separated. For example, the separation includes a sawing process. In another example, each die includes an integrated circuit. At the process 420, leadframes are attached to tapes. For example, the tapes are used to protect bottom surfaces of the leadframes from being covered by an encapsulant material.

Figure 5:
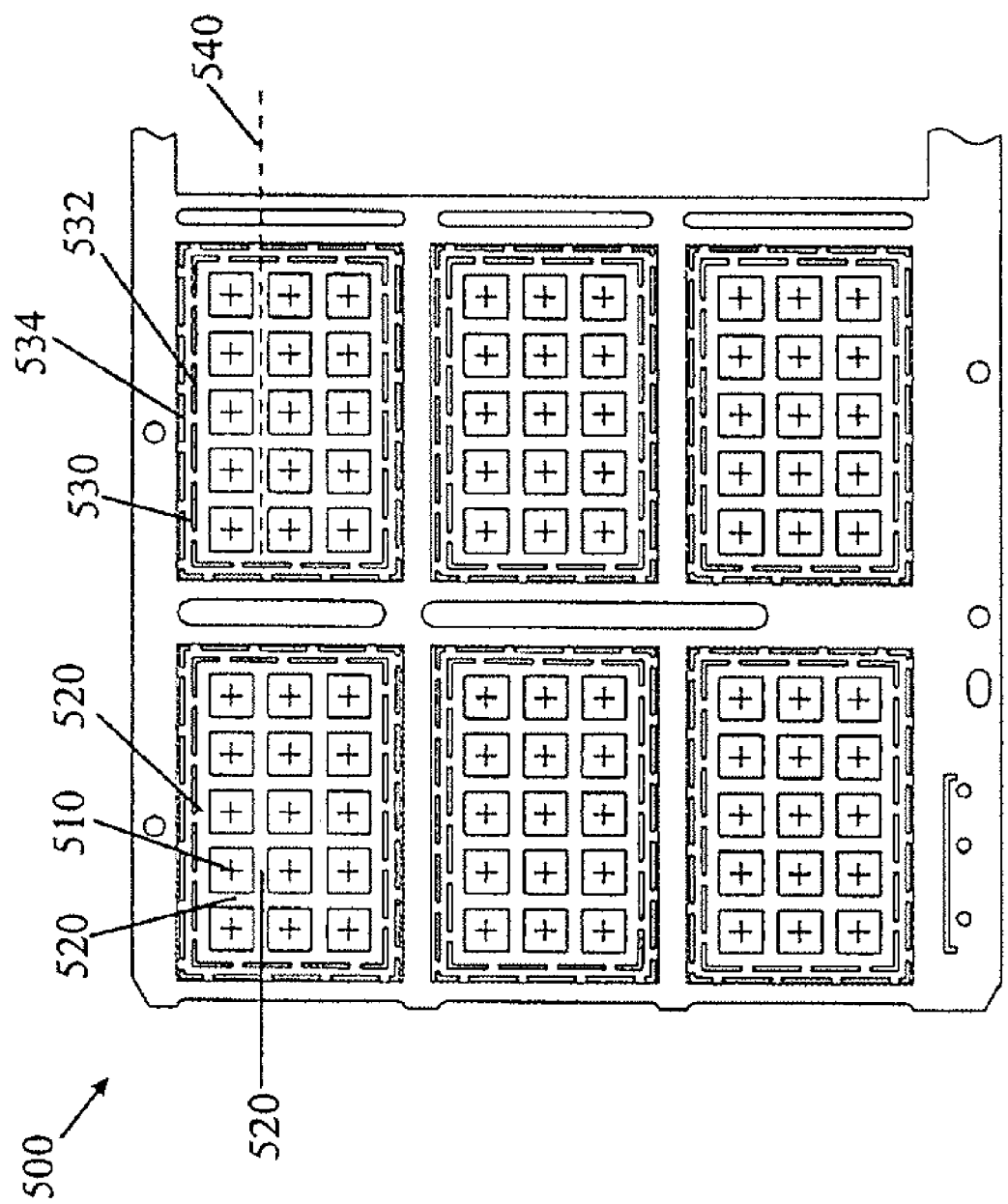
FIG. 5 shows a simplified leadframe according to an embodiment of the present invention.

FIG. 5 shows a simplified leadframe according to an embodiment of the present invention. This diagram is merely an example, which should not unduly limit the scope of the claims. One of ordinary skill in the art would recognize many variations, alternatives, and modifications. A leadframe 500 includes a plurality of packaging units 510 arranged in a matrix array. For example, each of the packaging units 510 includes the die pad 320 and the leads 330. The leads 330 are connected to metal strips 520, some of which lie between adjacent packaging units. Additionally, the leadframe 500 includes an outer frame 530 with stress-relief structure. In one embodiment, the stress-relief structure includes two rows of elongated openings 532 and 534. For example, the rows 532 and 534 surround a plurality of packing units on four sides. At each side, a line 540 perpendicular to the side intersects at least one elongated opening in the row 532 or the row 534. In another embodiment, stress-relief structure is implemented with an inter-locking structure as described in U.S. patent application Ser. No. 09/909,934. U.S. patent application Ser. No. 09/909,934 is incorporated by reference herein for all purposes. In yet another embodiment, the stress-relief structure can prevent or slow down the delamination of transparent encapsulant from propagating from the plurality of packing units to packing units in other matrix arrays at the process 450 as discussed below. In yet another embodiment, the leadframe 500 also includes a plurality of connecting bars. The plurality of connecting bars is attached to the outer frame and defines a plurality of inner frames arranged in a matrix pattern within the outer frame. The plurality of inner frames includes a plurality of die pads respectively.

Returning to FIG. 4, at the process 430, the dies separated at the process 410 are attached to the die pads. For example, the die pads are the ones of the leadframe 500. In one embodiment, the attachment is performed to the die pad 320 through the bonding layer 340. For example, the bonding layer 340 is cured through a heat treatment. At the process 440, conductive wires are bonded between the dies and the leads. For example, the conductive wires include the conductive wires 360.

At the process 450, a transparent encapsulant is applied. In one embodiment, the encapsulant material is injected into a cavity. The cavity includes four side boundaries that lie roughly on top of the outer frame 530. For example, the injection is performed in an environment with a dust count lower than or equal to about 30 k parts per million (PPM). The temperature of the encapsulant material ranges from 140° C. to 160° C., and the transfer pressure of the encapsulant ranges from 1100 psi to 1400 psi. After the injection, the encapsulant is baked with clamping. For example, a clamping magazine and interleave are applied to the encapsulant material. In another example, the baking process takes about 3 to 6 hours with a temperature ranging from 125° C. to 160° C.

In one embodiment, the transparent encapsulant is the encapsulant material 370. For example, the encapsulant material can be seen through by naked human eyes. In another example, the encapsulant material provides a transmission rate higher than or equal to 80% for wavelengths higher than or equal to about 350 nm. In yet another example, the encapsulant material includes a clear plastic, such as one selected from CV series of Matsushita Electric Works, Ltd, NT series of Nitto Denko Corporation, and MG-97 series from Henkel Corporation.

At the process 460, plating layers are formed on the bottom surfaces of the leadframes. These bottom surfaces are taped at the process 420 and not covered by the encapsulant material. At the process 470, the IC packages are singulated. For example, the singulation process uses the sawing technique and/or the punching technique. In one embodiment, each IC package corresponds to a packaging unit in FIG. 5. For each packaging unit, its leads are severed from the metal strips 520. Additionally, the packaging units within the outer frame 530 belong to the same cavity. The encapsulant material that cover these packaging units are connected to each other. The singulation process also separates the encapsulant material into individual IC packages. In another embodiment, the individual IC packages each are the package 300.

As discussed above and further emphasized here, FIG. 4 is merely an example, which should not unduly limit the scope of the claims herein. One of ordinary skill in the art would recognize many variations, alternatives, and modifications. In one embodiment, a process for providing package identifications is performed after the process 410. For example, two-dimensional markings are printed on the bottom surfaces of the leadframes. In another embodiment, a process for detaching leadframes is performed during the process 450. For example, the tapes are detached from the leadframes at a temperature ranging from 80° C. to 120° C. after the transparent encapsulant is injected but before the encapsulant is baked. In yet another embodiment, after the process 470, a process for inspecting packages is performed. For example, this process includes the inspection of the bottom surfaces of the packages and the quality assurance inspection.

Some embodiments of the present invention, such as the method 400, use a cavity with side boundaries that lie approximately on top of the outer frame 530. For example, the outer frame 530 includes the stress relief structure as shown in FIG. 5. The leadframe 500 includes the plurality of packaging units 510 that are arranged in a matrix array. This arrangement enables cavities with one common size to be used for making packages of various sizes.

Figure 6:
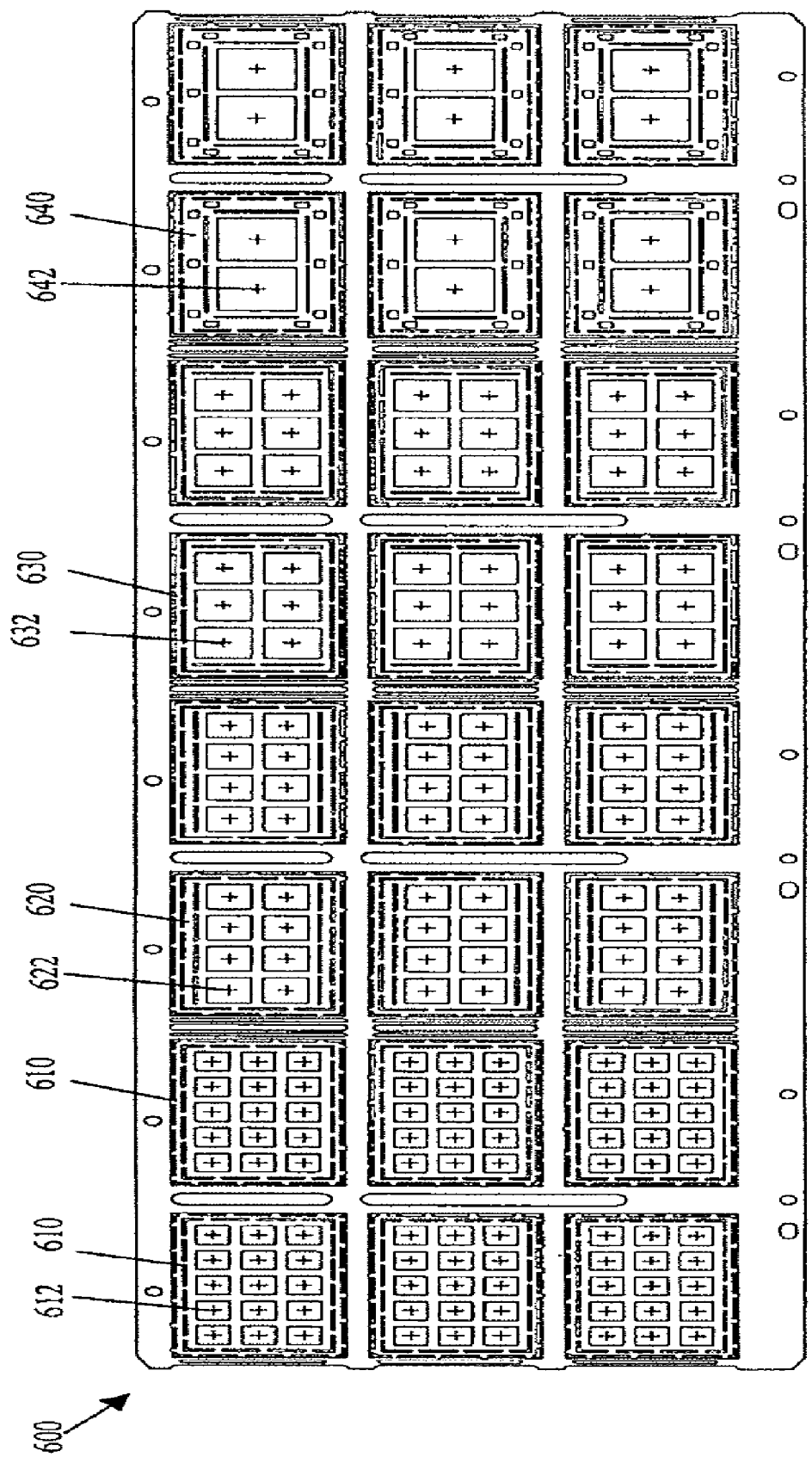
FIG. 6 shows a simplified leadframe used for making packages with various sizes according to an embodiment of the present invention.

FIG. 6 shows a simplified leadframe used for making packages with various sizes according to an embodiment of the present invention. This diagram is merely an example, which should not unduly limit the scope of the claims. One of ordinary skill in the art would recognize many variations, alternatives, and modifications. A leadframe 600 includes a plurality of regions. Each region includes an array of packaging units 612, 622, 632, or 642 and is surrounded by an outer frame 610, 620, 630, or 640 respectively. The packaging units 612, 622, 632, and 642 are used for making packages of different sizes. The outer frames 610, 620, 630, and 640 have approximately the same size and can be used for cavities of the same size at the process 450. As shown in FIG. 6, the outer frames 610, 620, 630 and 640 each include stress relief structures, which may vary with different outer frames.

Figure 7:
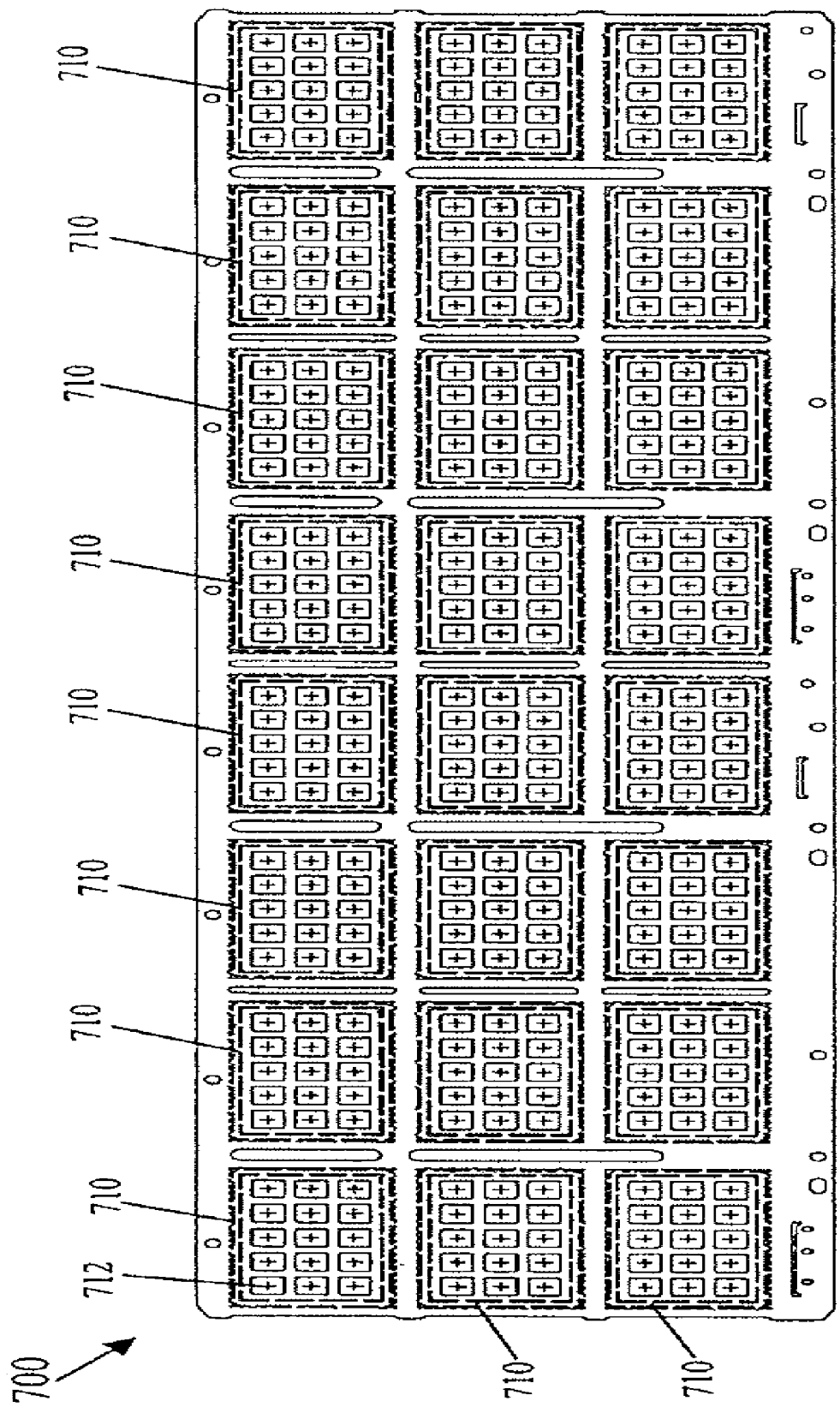
FIG. 7 shows a simplified leadframe used for making packages of the same size according to another embodiment of the present invention.

FIG. 7 shows a simplified leadframe used for making packages of the same size according to another embodiment of the present invention. This diagram is merely an example, which should not unduly limit the scope of the claims. One of ordinary skill in the art would recognize many variations, alternatives, and modifications. A leadframe 700 includes a plurality of regions. Each region includes an array of packaging units 712 and is surrounded by an outer frame 710 respectively. The packaging units 712 are used for making packages of the same size. The outer frames 710 have approximately the same size and can be used for cavities of the same size at the process 450. As shown in FIG. 6, the outer frames 610 each include stress relief structures, such as the one for the outer frame 530.

The use of one cavity to make a plurality of packages with transparent encapsulants is a significant advancement in the field of IC packaging. Without this improvement, each package is molded with individual cavity pockets. The individual cavities often require cavities of different sizes be used for different package sizes. In contrast, using the same cavity for different package sizes can significantly reduce costs and shortens turnaround times.

The use of same cavities for different package sizes is difficult to accomplish according to conventional techniques. One reason for such difficulty is significant differences in thermal expansion coefficient between a transparent encapsulant and a leadframe or other components of an IC package. These components include a bonding layer, a die, and conductive wires, and the leadframe includes leads and a die pad. For example, the die is made of silicon and the conductive wires are made of gold. During cooling stage after high temperature molding, the transparent encapsulant, the leadframe, and other components of the IC package usually shrink differently. This difference in shrinkage often causes warpage and mechanical stress to the molded package.

The warpage and mechanical stress can get worse as the package size gets larger. Also, if the transparent encapsulant is molded on only one side, instead of two sides, of the leadframe, the warpage and mechanical stress usually exacerbate. If both sides of the leadframe are covered by the transparent encapsulant, the shrinkage of the top and bottom halves of the IC package can neutralize each other and thus reduce the warpage.

Due to severe warpage and mechanical stress, the conventional techniques cannot use one cavity to make a plurality of transparent IC packages with the same size or different sizes. If the warpage is larger than about 0.4 mm, the package singulation process can cause the singulated packages to fly off from the holder with sticky tape. If the holder uses a mechanical jig with vacuum base to hold individual units, the tolerance for the warpage becomes even tighter as the mechanical jig is not elastic like the sticky tape.

In contrast, certain embodiments of the present invention have overcome the above problems associated with warpage and mechanical stress. As shown in FIGS. 5-7, the array molded design of the present invention can share the common equipment between different packages sizes, and thus avoid or reduce dedicated tooling or equipment. These embodiments of the present invention can lower capital expenses, improve equipment utilization, and shorten lead times for tooling up different package sizes.

The problems associated with warpage and mechanical stress have been overcome by using the method 400 according to some embodiments of the present invention. The inventors have discovered that using the transparent encapsulant with a temperature ranging from 140° C. to 160° C. at the process 450 can significantly reduce the warpage and stress.

Additionally, the inventors have discovered that for the process 450, the injection of transparent encapsulant should be preferably performed in an environment with a dust count lower than or equal to about 30 k parts per million (PPM). Such dust count can significantly reduce the number of foreign particles in the IC package. Moreover, the transfer pressure of the transparent encapsulant ranges from 1100 psi to 1400 psi according to an embodiment of the present invention.

The present invention has various advantages. Certain embodiments of the present invention provide IC packages with transparent encapsulants. For example, the transparent encapsulants are both reliable and durable. Some embodiments of the present invention provide a method that can easily apply transparent encapsulants. Certain embodiments of the present invention can prevent or reduce delamination of transparent encapsulants. For example, the delamination of transparent encapsulants may occur during cooling and result in warpage and delamination rejects of the IC packages. Some embodiments of the present invention use stress-relief structures in a leadframe. The stress-relief structures can prevent or reduce the propagation of delamination of transparent encapsulants. Certain embodiments of the present invention apply transparent encapsulants to only one side of a leadframe. The amount of transparent encapsulant used is reduced and the fabrication costs are lowered. Some embodiments of the present invention provide transparent IC packages with improved heat dissipation, smaller size, and/or lighter weight. Certain embodiments of the present invention use matrix arrays of packaging units. These packaging units are singulated as an individual optical devices and/or packages. For example, the matrix arrays allow the use of a single mould for making packages of various sizes and shapes. Some embodiments of the present invention provide locking mechanisms. For example, the locking mechanisms include extended parts 322 and 332. During encapsulation, the heat causes the encapsulants to melt and flow under the extended parts. After cooling, the encapsulants under the locking mechanisms can prevent or reduce the delamination of transparent encapsulants.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A method for making an IC package with transparent encapsulant, the method comprising:
    providing a leadframe comprising an outer frame and a plurality of regions;
    forming a cavity in the leadframe, wherein the cavity includes side boundaries that lie on top of the outer frame;
    disposing a plurality of packaging units in the cavity;
    injecting an encapsulant material into the cavity encapsulating an array of package units;
    cutting the injected encapsulant material and the leadframe to form a first IC package and a second IC package;
    wherein:
        the encapsulant material is transparent for visible wavelengths; and
        the injecting an encapsulant material is performed at an encapsulant temperature ranging from 140° C. to 160° C.

2. The method of claim 1 wherein the injecting an encapsulant material comprising transferring the encapsulant material at a pressure ranging from 1100 psi to 1400 psi.

3. The method of claim 2 wherein the injecting an encapsulant material is further performed in an environment with a dust count lower than or equal to about 30k parts per million (PPM).

4. The method of claim 1 wherein the encapsulant material is configured to provide a transmission rate higher than or equal to 80% for a wavelengths longer than or equal to 350 nm.

5. The method of claim 1 wherein the encapsulant material comprises a plastic.

6. The method of claim 1 wherein the leadframe comprises an outer frame surrounding a plurality of die pads, the plurality of die pads including the first die pad and the second die pad.

7. The method of claim 6 wherein the plurality of die pads forms a two dimensional array.

8. The method of claim 6 wherein the forming a cavity comprises forming a plurality of side boundaries approximately on the outer frame.

9. The method of claim 6 wherein the outer frame comprises a plurality of elongated openings around the circumference of the outer frame.

10. The method of claim 1 wherein the packaging units are the same size.

11. The method of claim 1 wherein the packaging units are different sizes.

* * * * *